(12) United States Patent
Takenaka et al.

(10) Patent No.: US 8,431,459 B2
(45) Date of Patent: Apr. 30, 2013

(54) SEMICONDUCTOR WAFER, SEMICONDUCTOR DEVICE, AND METHOD OF MANUFACTURING A SEMICONDUCTOR DEVICE

(75) Inventors: Mitsuru Takenaka, Tokyo (JP); Shinichi Takagi, Tokyo (JP); Masahiko Hata, Ibaraki (JP); Osamu Ichikawa, Chiba (JP)

(73) Assignee: The University of Tokyo, Tokyo (JP)

( * ) Notice: Subject to any disclaimer, the term of this patent is extended or adjusted under 35 U.S.C. 154(b) by 330 days.

(21) Appl. No.: 12/934,233

(22) PCT Filed: Mar. 26, 2009

(86) PCT No.: PCT/JP2009/001375
§ 371 (c)(1),
(2), (4) Date: Sep. 23, 2010

(87) PCT Pub. No.: WO2009/119103
PCT Pub. Date: Oct. 1, 2009

(65) Prior Publication Data
US 2011/0018033 A1 Jan. 27, 2011

(30) Foreign Application Priority Data
Mar. 26, 2008 (JP) ................................. 2008-082081

(51) Int. Cl.
*H01L 21/00* (2006.01)
(52) U.S. Cl.
USPC .............................. 438/285; 438/586; 438/22
(58) Field of Classification Search ............... 438/285, 438/586, 22
See application file for complete search history.

(56) References Cited

U.S. PATENT DOCUMENTS 4,622,114 A * 11/1986 Glass et al. ................... 205/655
5,726,462 A * 3/1998 Spahn et al. .................... 257/76

(Continued)

FOREIGN PATENT DOCUMENTS

| JP | 2001-102691 A | | 4/2001 |
| JP | 2004031861 A | * | 1/2004 |

(Continued)

OTHER PUBLICATIONS

Narayan Chandra Paul et al., "Oxidation of InAlAs and Its Application to Gate Insulator of InAlAs/InGaAs Metal Oxide Semiconductor High Electron Mobility Transistor," Japanese Journal of Applied Physics, vol. 44, No. 3, 2005, pp. 1174-1180.

(Continued)

*Primary Examiner* — Laura Menz
(74) *Attorney, Agent, or Firm* — Sughrue Mion, PLLC

(57) ABSTRACT

It is an objective of the present invention to form a favorable interface between an oxide layer and a group 3-5 compound semiconductor using a practical and simple method.

Provided is a semiconductor wafer comprising a first semiconductor layer that is a group 3-5 compound not containing arsenic and that lattice matches or pseudo-lattice matches with InP; and a second semiconductor layer that is formed to contact the first semiconductor layer, is a group 3-5 compound semiconductor layer that lattice matches or pseudo-lattice matches with InP, and can be selectively oxidized relative to the first semiconductor layer. Also provided is a semiconductor device comprising a first semiconductor layer that is a group 3-5 compound not containing arsenic and that lattice matches or pseudo-lattice matches with InP; an oxide layer formed by selectively oxidizing, relative to the first semiconductor layer, at least a portion of a second semiconductor layer that is a group 3-5 compound formed to contact the first semiconductor layer and that lattice matches or pseudo-lattice matches with InP; and a control electrode that adds an electric field to a channel formed in the first semiconductor layer.

5 Claims, 4 Drawing Sheets

U.S. PATENT DOCUMENTS

| | | | |
|---|---|---|---|
| 6,326,650 B1 * | 12/2001 | Allam | 257/186 |
| 6,407,407 B1 * | 6/2002 | Johnson et al. | 257/18 |
| 6,417,519 B1 * | 7/2002 | Imanishi et al. | 257/11 |
| 6,493,366 B1 * | 12/2002 | Johnson et al. | 372/45.011 |
| 6,597,017 B1 * | 7/2003 | Seko et al. | 257/79 |
| 6,610,612 B2 * | 8/2003 | Dagenais et al. | 438/767 |
| 6,831,309 B2 * | 12/2004 | Giboney | 257/184 |
| 6,992,319 B2 * | 1/2006 | Fahimulla et al. | 257/20 |
| 7,149,236 B1 * | 12/2006 | Verma et al. | 372/50.124 |
| 7,276,723 B2 * | 10/2007 | Fathimulla et al. | 257/20 |
| 8,243,139 B2 * | 8/2012 | Nagai et al. | 348/148 |
| 8,329,541 B2 * | 12/2012 | Ye et al. | 438/285 |
| 2002/0127758 A1 * | 9/2002 | Dagenais et al. | 438/46 |
| 2002/0185655 A1 * | 12/2002 | Fahimulla et al. | 257/192 |
| 2004/0113143 A1 * | 6/2004 | Fujimoto | 257/22 |
| 2004/0119129 A1 * | 6/2004 | Giboney | 257/458 |
| 2005/0243881 A1 * | 11/2005 | Kwon et al. | 372/46.01 |
| 2005/0243889 A1 * | 11/2005 | Kim et al. | 372/99 |
| 2005/0285098 A1 * | 12/2005 | Fathimulla et al. | 257/20 |
| 2011/0018033 A1 * | 1/2011 | Takenaka et al. | 257/192 |
| 2011/0164136 A1 * | 7/2011 | Nagai et al. | 348/148 |
| 2012/0205747 A1 * | 8/2012 | Yamada et al. | 257/368 |
| 2012/0274771 A1 * | 11/2012 | Nagai et al. | 348/148 |

FOREIGN PATENT DOCUMENTS

| | | | |
|---|---|---|---|
| JP | 2008258563 A | * | 10/2008 |
| JP | 2009238955 A | * | 10/2009 |
| WO | WO 2009119103 A1 | * | 10/2009 |

OTHER PUBLICATIONS

Office Action issued Jan. 5, 2012, in Chinese Patent Application No. 200980107412.2 with English translation.

Seong-Ju Bae, et al., "Characteristics of InAlAs/InP and InAlP/GaAs Native Oxides", Solid-State Electronics, 2006, pp. 1625-1628, vol. 50.

C. M. Hanson, et al., "$In_xAl_{1-x}As$/InP Heterojunction Insulated Gate Field Effect Transistors (HIGFET's)", IEEE Electron Device Letters, Feb. 1987, pp. 53-54, vol. EDL-8, No. 2.

A. Fathimulla, et al., "A Novel Insulated-Gate InP/InAlAs MODFET", Indium Phosphide and Related Materials, 1993, pp. 428-431, Fifth International Conference.

K. Nakamura, et al., "Depletion/Enhancement Mode InAlA/InGaAs-MOSHEMTs with nm-Thin Gate Insulating Layers Formed by Oxidation of the InAlAs Layer", International Conference on Indium Phoshide and Related Materials Conference Proceeding, Jun. 2004, pp. 191-194.

Shota Nakagawa, et al., "InAlAs Sentaku Sanka Ni Yoru III-V MOS kaimen Kozo no Kaisei", Dai 55 Kai Extended Abstracts, Japan Society of Applied Physics and Related Societies, Mar. 2008, p. 860.

Chinese Office Action issued in corresponding application No. 200980107412.2 dated Sep. 17, 2012.

Japanese Office Action issued in correspondence Application No. 2008-082081 dated Feb. 19, 2013.

* cited by examiner

SEMICONDUCTOR WAFER, SEMICONDUCTOR DEVICE, AND METHOD OF MANUFACTURING A SEMICONDUCTOR DEVICE

TECHNICAL FIELD

The present invention relates to a semiconductor wafer, a semiconductor device, and a method of manufacturing a semiconductor device. In particular, the present invention relates to a semiconductor wafer that is effectively used in a compound semiconductor device and that can form a MOS configuration through simple steps, a semiconductor device, and a method of manufacturing a semiconductor device.

BACKGROUND ART

Due to having high electron mobility, application of a MOSFET (Metal Oxide Semiconductor Field Effect Transistor) with a compound semiconductor is desired. For example, Non-Patent Document 1 discloses oxidation processing of InAlAs and applications of this processing for semiconductor wafers used in manufacturing semiconductor devices. Specifically, Non-Patent Document 1 describes, based on an assumption of use as a gate insulating layer in an HEMT (High Electron Mobility Transistor) that is an InAlAs/InGaAs-based MOS, forming a semiconductor wafer by oxidizing an n-type InAlAs layer above an InGaAs layer functioning as a channel layer.

Non-Patent Document 1: N. C. Paul et al., Jpn. J. Appl, Phys., Vol. 44 (2005), No. 3, pp. 1174-1180

DISCLOSURE OF THE INVENTION

Problems to be Solved by the Invention

In a semiconductor wafer having a compound semiconductor such as a group 3-5 compound semiconductor, however, it is difficult to form a favorable MOS interface, i.e. an interface between the semiconductor layer and the oxide layer, and this impedes the manufacturing of semiconductor devices. Therefore, a semiconductor wafer is desired that can be formed using simple and practical techniques to have a favorable interface between the group 3-5 compound semiconductor and the oxide layer.

Means for Solving the Problems

According to a first aspect of the present invention for solving the above problems, provided is a semiconductor wafer comprising a first semiconductor layer that is a group 3-5 compound not containing arsenic and that lattice matches or pseudo-lattice matches with InP; and a second semiconductor layer that is formed to contact the first semiconductor layer, is a group 3-5 compound semiconductor layer that lattice matches or pseudo-lattice matches with InP, and can be selectively oxidized relative to the first semiconductor layer. The first semiconductor layer need not contain aluminum. The semiconductor wafer may comprise a 3-5 compound semiconductor that is formed to contact the first semiconductor layer, lattice matches or pseudo-lattice matches with InP, and has an electron infinity higher than that of InP. The second semiconductor layer may contain aluminum. Specifically, the second semiconductor layer may be $In_xAl_{1-x}As$, where x is a value between 0 and 1.

According to a second aspect of the present invention, provided is a semiconductor device comprising a first semiconductor layer that is a group 3-5 compound not containing arsenic and that lattice matches or pseudo-lattice matches with InP; an oxide layer obtained by selectively oxidizing, relative to the first semiconductor layer, at least a portion of a second semiconductor layer that is formed to contact the first semiconductor layer and that is a group 3-5 compound semiconductor layer lattice matching or pseudo-lattice matching with InP; and a control electrode that adds an electric field to a channel formed in the first semiconductor layer. The oxide layer may be a control electrode insulating layer formed between the first semiconductor layer and the control electrode, or a buried oxide layer formed to be buried farther on the wafer side than the first semiconductor layer. A non-oxidized portion of the second semiconductor layer may remain in the same layer as the oxide layer, and the semiconductor device may comprise an ohmic layer that is formed above the non-oxidized portion of the second semiconductor layer and that includes an open portion in a region where the oxide layer is formed; and a pair of input/output electrodes that are formed above the ohmic layer and that supply current flowing through the channel. The control electrode may be funned on the oxide layer within the open portion. The ohmic layer may be a group 3-5 compound semiconductor layer that does not contain aluminum and that lattice matches or pseudo-lattice matches with InP, and may be doped to be p-type or n-type.

According to a third aspect of the present invention, provided is a method of manufacturing a semiconductor device, comprising preparing a semiconductor wafer including (i) a first semiconductor layer that is a group 3-5 compound not containing arsenic and that lattice matches or pseudo-lattice matches with InP and (ii) a second semiconductor layer that is a group 3-5 compound formed to contact the first semiconductor layer and that lattice matches or pseudo-lattice matches with InP; forming an oxide layer by selectively oxidizing the second semiconductor layer relative to the first semiconductor layer; and forming a control electrode above the oxide layer. The method of manufacturing a semiconductor device may further comprise, alter preparing the semiconductor wafer, forming an ohmic layer that covers the second semiconductor layer; and forming an open portion in the ohmic layer to expose the second semiconductor layer at a bottom of the open portion, wherein forming the oxide layer includes selectively forming the oxide layer in the open portion by oxidizing the second semiconductor layer exposed in the open portion. Forming the oxide layer may include exposing, in an oxidation atmosphere, the second semiconductor layer exposed by the open portion with the ohmic layer as a mask to form the oxide layer in a self-aligning manner with the mask. The ohmic layer may be a p-type or n-type group 3-5 compound semiconductor layer that does not contain aluminum and that lattice matches or pseudo-lattice matches with InP. Forming the oxide layer includes using wet oxidation to form the oxide layer.

According to a fourth aspect of the present invention, provided is a semiconductor wafer comprising a first semiconductor that is formed of a group 3-5 compound not containing arsenic and that functions as a channel of a transistor; and a second semiconductor that is disposed above the first semiconductor and that is oxidized in an oxidation atmosphere to become an insulator. The first semiconductor and the second semiconductor may lattice match or pseudo-lattice match with 10. The first semiconductor need not be oxidized in an oxidation atmosphere. The second semiconductor can be selectively oxidized by arranging; on the surface thereof, a mask that covers a non-oxidized region and exposes an oxidized region.

Figure 1:
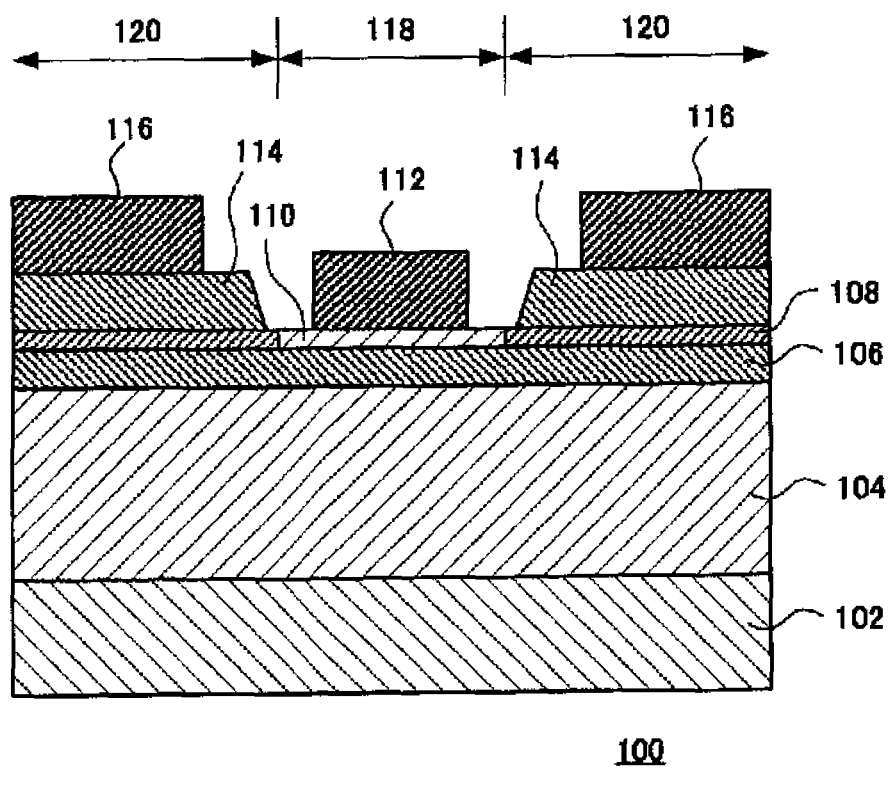
FIG. 1 shows an exemplary cross section of a semiconductor device 100 according to the present embodiment.

LIST OF REFERENCE NUMERALS 100 semiconductor device
102 wafer
104 buffer layer
106 first semiconductor layer
108 second semiconductor layer
110 oxide layer
112 control electrode
114 ohmic layer
116 input/output electrode
118 open region
120 region

BEST MODE FOR CARRYING OUT THE INVENTION

FIG. 1 shows an exemplary cross section of a semiconductor device 100 according to an embodiment of the present invention. The semiconductor device 100 includes a wafer 102, a buffer layer 104, a first semiconductor layer 106, a second semiconductor layer 108, an oxide layer 110, a control electrode 112, an ohmic layer 114, and input/output electrodes 116.

The wafer 102 can be made of any material that allows a compound semiconductor crystal layer to be formed on a surface thereof. For example, the wafer 102 may be a single-crystal silicon wafer, a sapphire wafer, or a single-crystal InP wafer.

The buffer layer 104 may be a compound semiconductor layer that lattice matches or pseudo-lattice matches with the first semiconductor layer 106, and is formed between the wafer 102 and the first semiconductor layer 106. The buffer layer 104 may be formed in order to increase the crystallinity of the first semiconductor layer 106 or to decrease the effect of impurities from the wafer 102. The buffer layer 104 may be an InP layer, an InGaAs layer, an InAlAs layer, or a layered combination of these layers, and these layers may be undoped or doped with impurities. In this case, the InP layer, InGaAs layer, or InAlAs layer can be formed using MOCVD (metalorganic chemical vapor deposition) with an organic metal as a raw material gas.

The first semiconductor layer 106 may be a group 3-5 compound that does not contain arsenic and that lattice matches or pseudo-lattice matches with InP. The first semiconductor layer 106 may be a layer that does not contain aluminum. As a result of not containing aluminum, the first semiconductor layer 106 can be prevented from being oxidized when the oxide layer 110 is formed by oxidizing the second semiconductor layer 108. Furthermore, the first semiconductor layer 106 may have an electron affinity that is higher than that of InP. As a result of this higher electron affinity, the depth of the interface state formed at the interface between the first semiconductor layer 106 and the oxide layer 110 can be decreased. Therefore, the performance of the device can be improved.

The first semiconductor layer 106 may function as a functional layer of the electronic device, and may be a channel layer in which channels of a MISFET are formed. The first semiconductor layer 106 may be an InP layer. The first semiconductor layer 106 may be doped with impurities, but need not be doped. The first semiconductor layer 106 may be formed using MOCVD with an organic metal gas as a raw material gas.

Another semiconductor layer may be formed between the buffer layer 104 and the first semiconductor layer 106. The other semiconductor layer may contain arsenic. The semiconductor layer containing arsenic may be an InGaAs layer. The other semiconductor layer may be a channel layer in a MISFET, for example, or a channel layer may be formed by the other semiconductor layer and the first semiconductor layer 106. In this case, the channel may be formed at the interface between the other semiconductor layer and the first semiconductor layer 106, and may be positioned far from the interface with the oxide layer 110 formed above the first semiconductor layer 106. By positioning the channel far from the interface with the oxide layer 110, the effect of the interface state at the interface between the semiconductor and the insulator can be avoided, thereby improving the performance of the device.

The second semiconductor layer 108 is formed to contact the first semiconductor layer 106. The second semiconductor layer 108 may be a group 3-5 compound semiconductor layer that lattice matches or pseudo-lattice matches with InP. The second semiconductor layer 108 may be selectively oxidized relative to the first semiconductor layer 106. The second semiconductor layer 108 may contain aluminum, specifically $In_xAl_{1-x}As$ (0<x<1), It should be noted that the amount of aluminum is desirably 50% or more than the amount of Indium.

The oxide layer 110 is formed to contact the first semiconductor layer 106, and is formed by selectively oxidizing, relative to the first semiconductor layer 106, at least a portion the second semiconductor layer 108. The selective oxidation of the second semiconductor layer 108 can be performed by forming a mask on the second semiconductor layer 108 that exposes an oxidation region that becomes the oxide layer 110 and covers other regions that are not to be oxidized. The oxide layer 110 may be a gate insulating layer when used in a MOSFET, that is, an insulating layer that insulates the control electrode and that is formed between the first semiconductor layer 106 and the control electrode 112. Instead, the oxide layer 110 may be a buried oxide layer that is buried farther towards the wafer 102 than the first semiconductor layer 106. When the oxide layer 110 is a buried oxide layer, a MOSFET with a double gate structure can be formed.

Since the oxide layer 110 is formed by oxidizing the second semiconductor layer 108, the composition of the oxide layer 110 is determined by the composition of the second semiconductor layer 108. The second semiconductor layer 108 may be formed by wet oxidation, for example. When the second semiconductor layer 108 is oxidized to form the oxide layer 110 using wet oxidation at a temperature of 500° C. or more, the interface state density can be decreased to the order of $10^{12}$.

The control electrode 112 is formed on the oxide layer 110, and adds an electric field to the channel formed on the first semiconductor layer 106. The control electrode 112 can function as a gate electrode of a MISFET, for example. The control electrode 112 may be any metal, polysilicon, metal silicide, or the like. The control electrode 112 is formed in an open region 118 where the oxide layer 110 is formed by oxidizing the second semiconductor layer 108.

The ohmic layer 114 exhibits ohmic bonding with the input/output electrodes 116. The ohmic Layer 114 is formed above the region 120 where the non-oxidized portion of the second semiconductor layer 108 remains in the same layer as the oxide layer 110. The ohmic layer 114 has an open region 118 in which is formed the oxide layer 110. The ohmic layer 114 may be a group 3-5 semiconductor layer that does not contain aluminum and that lattice matches or pseudo-lattice matches with InP. The ohmic layer 114 may be doped to be p-type or n-type.

The input/output electrodes 116 are formed above the ohmic layer 114 as a pair of electrodes. The input/output electrodes 116 supply the current flowing through the channel. The input/output electrodes 116 function as source and drain electrodes of a MISFET, for example. The input/output electrodes 116 may be metals such as nickel, platinum, or gold, heavily doped polysilicon, metal silicide, or the like.

The above describes a semiconductor device 100, but the wafer 102, the buffer layer 104, the first semiconductor layer 106, and the second semiconductor layer 108 may be understood as forming a single semiconductor wafer. This semiconductor wafer can be used to quickly manufacture a device such as a MOSFET by oxidizing the second semiconductor layer 108 to form a control electrode oxide layer. It is not necessary to form the buffer layer 104 on the semiconductor wafer, and so the first semiconductor layer 106 itself may be the wafer 102.

The above describes a MOSFET as an example of the semiconductor device 100, but the semiconductor device 100 may be another type of electronic device. For example, the semiconductor device 100 may be a capacitor in which the oxide layer 110 formed by oxidizing the second semiconductor layer 108 is sandwiched by the control electrode 112 and the first semiconductor layer 106.

Figure 2:
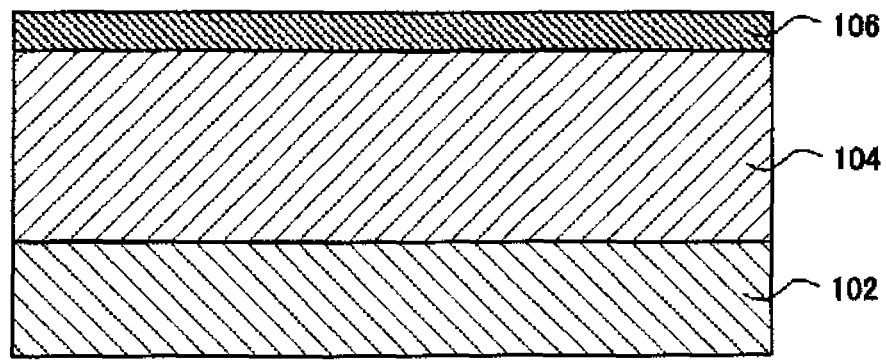
FIG. 2 is an exemplary cross-sectional view of a step for manufacturing the semiconductor device 100.

FIGS. 2 to 5 show exemplary cross sections in steps for manufacturing the semiconductor device 100. As shown in FIG. 2, the wafer 102 is prepared including the buffer layer 104 and the first semiconductor layer 106. The buffer layer 104 and the first semiconductor layer 106 can be formed by epitaxial growth using MOCVD.

Figure 3:
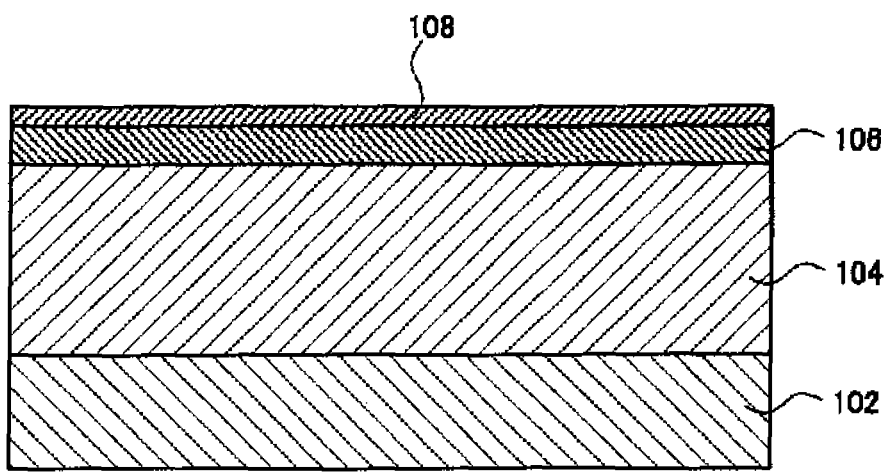
FIG. 3 is an exemplary cross-sectional view of a step for manufacturing the semiconductor device 100.

As shown in FIG. 3, the second semiconductor layer 108 is formed above the first semiconductor layer 106. The second semiconductor layer 108 can be formed using MOCVD, for example. The second semiconductor layer 108 may be doped to be p-type or n-type.

Figure 4:
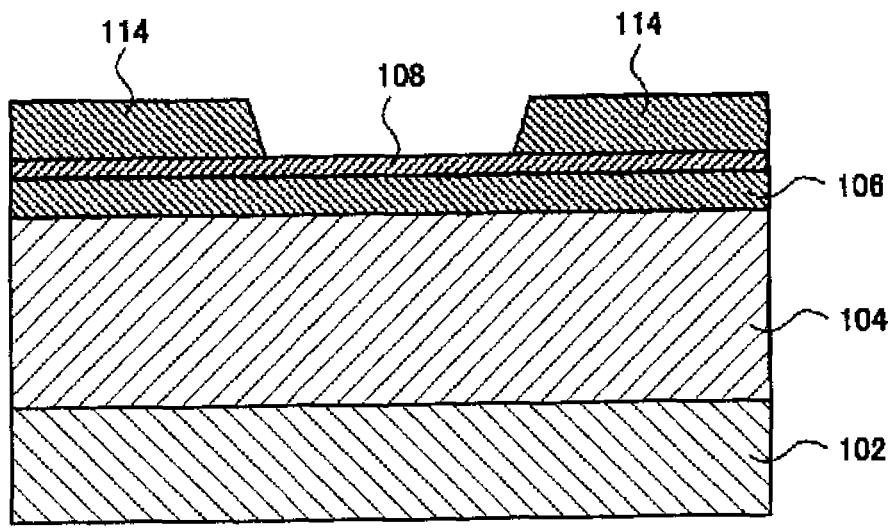
FIG. 4 is an exemplary cross-sectional view of a step for manufacturing the semiconductor device 100.
Figure 5:
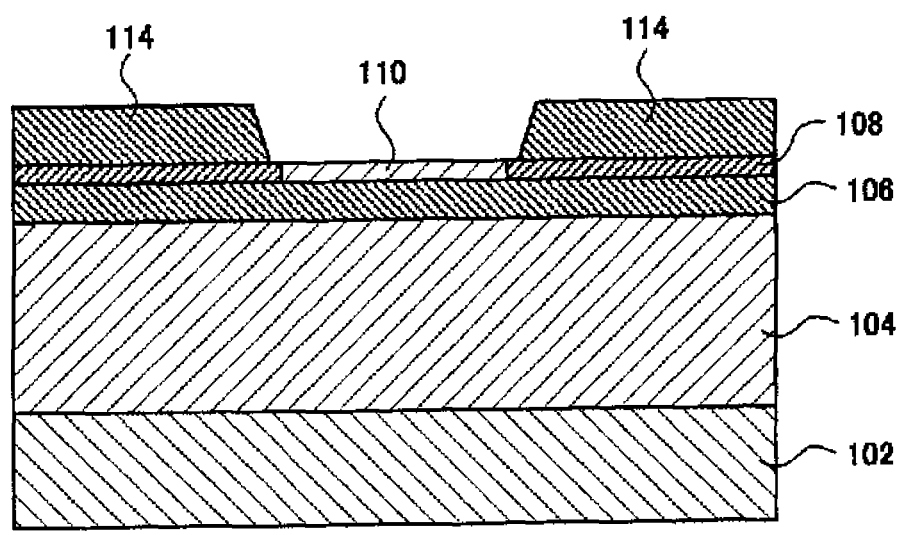
FIG. 5 is an exemplary cross-sectional view of a step for manufacturing the semiconductor device 100.

As shown in FIG. 4, after forming the ohmic layer 114 to cover the second semiconductor layer 108, an open portion is formed in the ohmic layer 114 to expose the second semiconductor layer 108 at the bottom of the open portion. As shown in FIG. 5, the ohmic layer 114 is used as a mask, and the second semiconductor layer 108 exposed in the open portion is oxidized. The oxidation is performed selectively, relative to the first semiconductor layer 106, on the second semiconductor layer 108. The oxidation is performed selectively on the second semiconductor layer 108 in the open portion of the ohmic layer 114. The oxide layer 110 is formed by oxidizing the second semiconductor layer 108.

The second semiconductor layer 108 contains aluminum, but the first semiconductor layer 106 and the ohmic layer 114 do not contain aluminum. Therefore, the first semiconductor layer 106 and the ohmic layer 114 are not oxidized when the oxidation is selectively applied to the second semiconductor layer 108 in a self-aligning manner with the open portion. As a result, the oxide layer 110 can be formed easily. The oxidation process in this case can be applied by exposing, in an oxidation atmosphere, the portion of the second semiconductor layer 108 exposed by the open portion.

After this, the control electrode 112 and the input/output electrodes 116 are formed by forming and patterning a conductive film. The semiconductor device 100 shown in FIG. 1 can be manufactured in the manner described above.

With the semiconductor device 100 described above, the second semiconductor layer 108 is selectively oxidized to form the oxide layer 110, and so the MOSFET can be manufactured easily. Furthermore, since wet oxidation is used, the interface state density can be decreased to form a practical compound semiconductor MOSFET.

EMBODIMENT

InAlAs was Formed to be 10 nm thick on a (100) surface of an InP wafer that was not doped with impurities. After this, the InAlAs layer was selectively oxidized to form the insulating film. For the oxidation process, wet oxidation at a temperature of 525° C. was used. Experimental samples were formed by depositing aluminum electrodes on the insulating film using vapor deposition.

Figure 6:
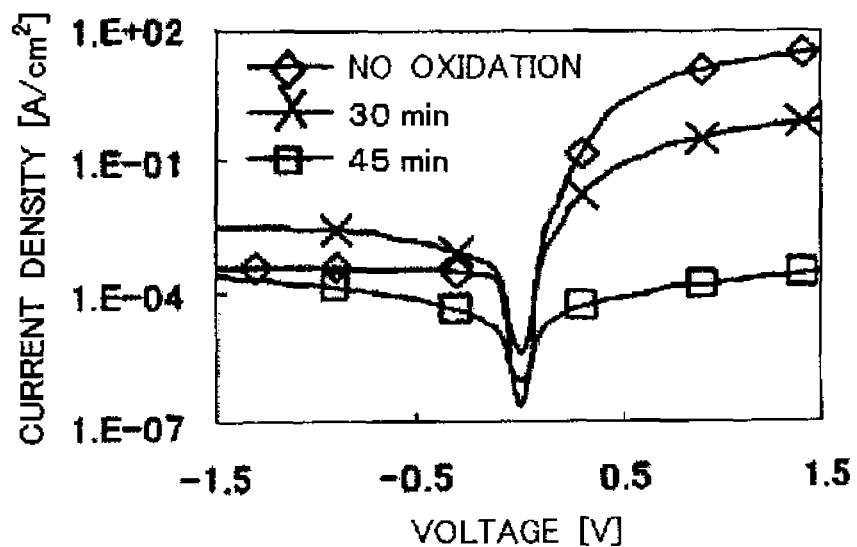
FIG. 6 shows current and voltage characteristics of the experimental samples.

FIG. 6 shows current and voltage characteristics of the experimental samples. Favorable insulation was confirmed for an experimental sample that underwent wet oxidation for 45 minutes. In comparison, a drop in insulation was confirmed for a sample that underwent wet oxidation for 30 minutes. An even greater drop in insulation was confirmed for a sample that did not undergo wet oxidation.

Figure 7:
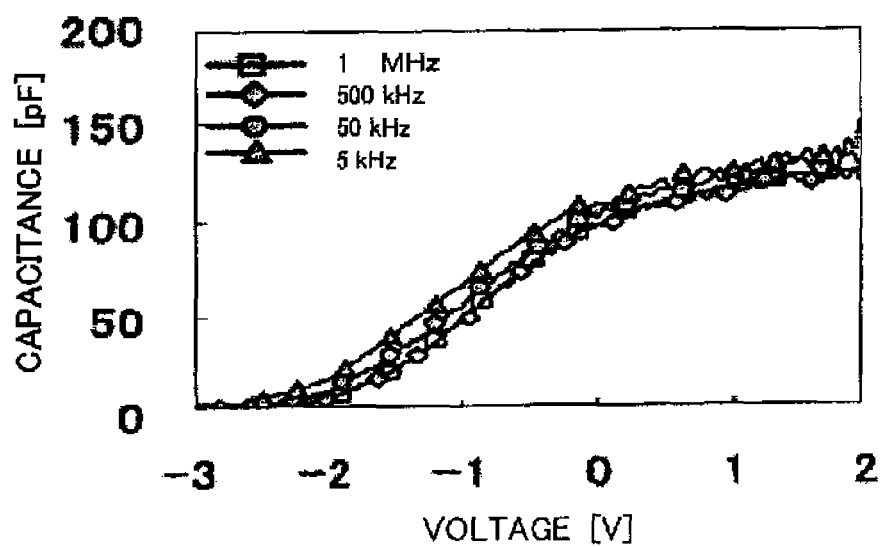
FIG. 7 shows capacitance and voltage properties of the experimental samples.

FIG. 7 shows capacitance and voltage characteristics of the experimental samples that underwent wet oxidation for 45 minutes. The capacitance change in response to a voltage change was confirmed to be within a range from 5 kHz to 1 MHz. In other words, it was confirmed that an inversion layer was formed on the InP layer below the insulating layer, enabling operation as a MOS. As a result of evaluating the interface state using conductance, interface state density with an order of $10^{12}$ was measured.

The invention claimed is:

1. A method of manufacturing a semiconductor device, comprising:
    preparing a semiconductor wafer including (i) a first semiconductor layer that is a group 3-5 compound not containing arsenic and that lattice matches or pseudo-lattice matches with InP and (ii) a second semiconductor layer that is a group 3-5 compound formed to contact the first semiconductor layer and that lattice matches or pseudo-lattice matches with InP;
    forming an oxide layer by selectively oxidizing the second semiconductor layer relative to the first semiconductor layer; and
    forming a control electrode above the oxide layer.

2. The method of manufacturing a semiconductor device according to claim 1, further comprising:
    after preparing the semiconductor wafer, forming an ohmic layer that covers the second semiconductor layer; and
    forming an open portion in the ohmic layer to expose the second semiconductor layer at a bottom of the open portion, wherein
    forming the oxide layer includes selectively forming the oxide layer in the open portion by oxidizing the second semiconductor layer exposed in the open portion.

3. The method of manufacturing a semiconductor device according to claim 2, wherein forming the oxide layer includes exposing, in an oxidation atmosphere, the second semiconductor layer exposed by the open portion with the ohmic layer as a mask to form the oxide layer in a self-aligning manner with the mask.

4. The method of manufacturing a semiconductor device according to claim 2, wherein the ohmic layer is a p-type or n-type group 3-5 compound semiconductor layer that does not contain aluminum and that lattice matches or pseudo-lattice matches with InP.

5. The method of manufacturing a semiconductor device according to claim 1, wherein forming the oxide layer includes using wet oxidation to form the oxide layer.

\* \* \* \* \*

UNITED STATES PATENT AND TRADEMARK OFFICE
CERTIFICATE OF CORRECTION

PATENT NO. : 8,431,459 B2
APPLICATION NO. : 12/934233
DATED : April 30, 2013
INVENTOR(S) : Mitsuru Takenaka et al.

It is certified that error appears in the above-identified patent and that said Letters Patent is hereby corrected as shown below:

Title Page, Item (73), Column 1, Assignee, delete "The University of Tokyo, Tokyo (JP)"

and insert -- SUMITOMO CHEMICAL COMPANY, LIMITED Tokyo (JP),
THE UNIVERSITY OF TOKYO, Tokyo (JP) --

Signed and Sealed this
Ninth Day of July, 2013

Teresa Stanek Rea
*Acting Director of the United States Patent and Trademark Office*